(12) United States Patent
Kohyama

(10) Patent No.: US 7,696,537 B2
(45) Date of Patent: Apr. 13, 2010

(54) STEP-EMBEDDED SIGE STRUCTURE FOR PFET MOBILITY ENHANCEMENT

(75) Inventor: Yusuke Kohyama, Poughkeepsie, NY (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 647 days.

(21) Appl. No.: 11/107,838

(22) Filed: Apr. 18, 2005

(65) Prior Publication Data

US 2006/0231826 A1 Oct. 19, 2006

(51) Int. Cl.
*H01L 31/00* (2006.01)
*H01L 29/04* (2006.01)

(52) U.S. Cl. .................. 257/199; 257/347; 257/627

(58) Field of Classification Search .......... 257/627, 257/347, 199, 369, 371, 344, 408, 336, 368, 257/338

See application file for complete search history.

(56) References Cited

U.S. PATENT DOCUMENTS

| 6,621,131 | B2 * | 9/2003 | Murthy et al. | 257/408 |
|---|---|---|---|---|
| 6,885,084 | B2 * | 4/2005 | Murthy et al. | 257/622 |
| 6,906,360 | B2 * | 6/2005 | Chen et al. | 257/204 |
| 6,991,972 | B2 * | 1/2006 | Lochtefeld et al. | 438/149 |
| 6,995,456 | B2 * | 2/2006 | Nowak | 257/627 |
| 7,176,073 | B2 * | 2/2007 | Bhattacharyya | 438/157 |
| 7,176,481 | B2 * | 2/2007 | Chen et al. | 257/19 |
| 7,279,746 | B2 * | 10/2007 | Doris et al. | 257/338 |

FOREIGN PATENT DOCUMENTS

CN 1667828 9/2005

OTHER PUBLICATIONS

K. Mistry, et al., "Delaying Forever: Uniaxial Strained Silicon Transistors in a 90nm CMOS Technology", 2004 Symposium on VLSI Technology, pp. 50-51.
P.R. Chidambaram, B., et al., "35% Drive Current Improvement from Recessed-SiGe Drain Extensions on 37nm Gate Length PMOS", 2004 Symposium on VLSI Technology, Digest of Technical Papers, pp. 48-49.
T. Ghani, et al., "A 90nm High Volume Manufacturing Logic Technology Featuring Novel 45nm Gate Length Strained Silicon CMOS Transistors"., IEDM Tech., Dig., pp. 978-980. 2003.
English Translation of the Notification of the First Office Action for CN200610075119.0 dated Apr. 18, 2008.

* cited by examiner

*Primary Examiner*—Howard Weiss
*Assistant Examiner*—Steven H Rao
(74) *Attorney, Agent, or Firm*—Banner & Witcoff, Ltd.

(57) ABSTRACT

A device, and method for manufacturing the same, including a PFET having an embedded SiGe layer where a shallow portion of the SiGe layer is closer to the PFET channel and a deep portion of the SiGe layer is further from the PFET channel. Thus, the SiGe layer has a boundary on the side facing toward the channel that is tapered. Such a configuration may allow the PFET channel to be compressively stressed by a large amount without necessarily substantially degrading extension junction characteristics. The tapered SiGe boundary may be configured as a plurality of discrete steps. For example, two, three, or more discrete steps may be formed.

14 Claims, 23 Drawing Sheets

STEP-EMBEDDED SIGE STRUCTURE FOR PFET MOBILITY ENHANCEMENT

FIELD OF THE INVENTION

Aspects of the present invention are generally directed to the use of embedded SiGe in a PFET, and more particularly to forming an embedded SiGe layer that tapers smoothly or in a step-like manner away from a PFET channel in order to provide increased compressive channel stress.

BACKGROUND OF THE INVENTION

As has been previously recognized, embedded silicon germanium (SiGe) technology has become a promising technology for producing silicon high-performance p-type field-effect transistors (PFETs). In particular, it has been shown that embedding SiGe in a silicon substrate next to a PFET channel causes compressive stress on the channel, thereby increasing hole mobility and increasing the performance of the PFET. This compressive stress property is discussed, for example, in an article entitled "35% Drive Current Improvement From Recessed-SiGe Drain Extensions on 37 nm Gate Length PMOS," by P. R. Chidambaram, et al., 2004 Symposium on VLSI Technology, Digest of Technical Papers, pp. 48-49.

Referring to FIG. 23, which has been substantially reproduced from the above-mentioned reference article, it can be seen that, in general, channel stress is related to the relative distance of the SiGe layer from the channel. More particularly, part (a) of FIG. 23 shows a 30 nm deep layer of SiGe extending toward the channel only as far as the source/drain (SD) region. Part (c) shows the same 30 nm deep layer of SiGe extending toward the channel, but this time extending further (and thus closer to the channel) into the drain extension (DE) region. As can be seen in the graph of part (b), the stress at the center of the channel (distance=0) is approximately 250 MPa for the part (a) configuration, whereas the stress at the center of the channel is approximately 900 MPa for the part (c) configuration. Therefore, it can be seen that channel stress is increased by forming the SiGe layer closer to the channel.

Since compressive channel stress in a PFET is good in that it increases hole mobility in the channel, it would be desirable to be able to increase the channel stress even more. However, attempting to do so most likely results in substantial complications to be overcome, as will be discussed later. Accordingly, new techniques need to be developed to increase channel stress without substantially degrading extension junction characteristics.

BRIEF SUMMARY OF THE INVENTION

Aspects of the present invention solve one or more of the above-stated problems. For example, aspects of the invention are directed to forming a PFET having an embedded SiGe layer where a shallow portion of the SiGe layer is closer to the PFET channel and a deep portion of the SiGe layer is further from the PFET channel. Thus, the SiGe layer has a boundary on the side facing toward the channel that is tapered. Such a configuration may allow the PFET channel to be compressively stressed by a large amount without necessarily substantially degrading extension junction characteristics.

Further aspects of the present invention are directed to forming the tapered SiGe boundary as a plurality of steps. For example, two, three, or more steps may be formed. These aspects provide a practical way to implement the tapered SiGe boundary.

These and other aspects of the invention will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF ILLUSTRATIVE EMBODIMENTS

Figure 1:
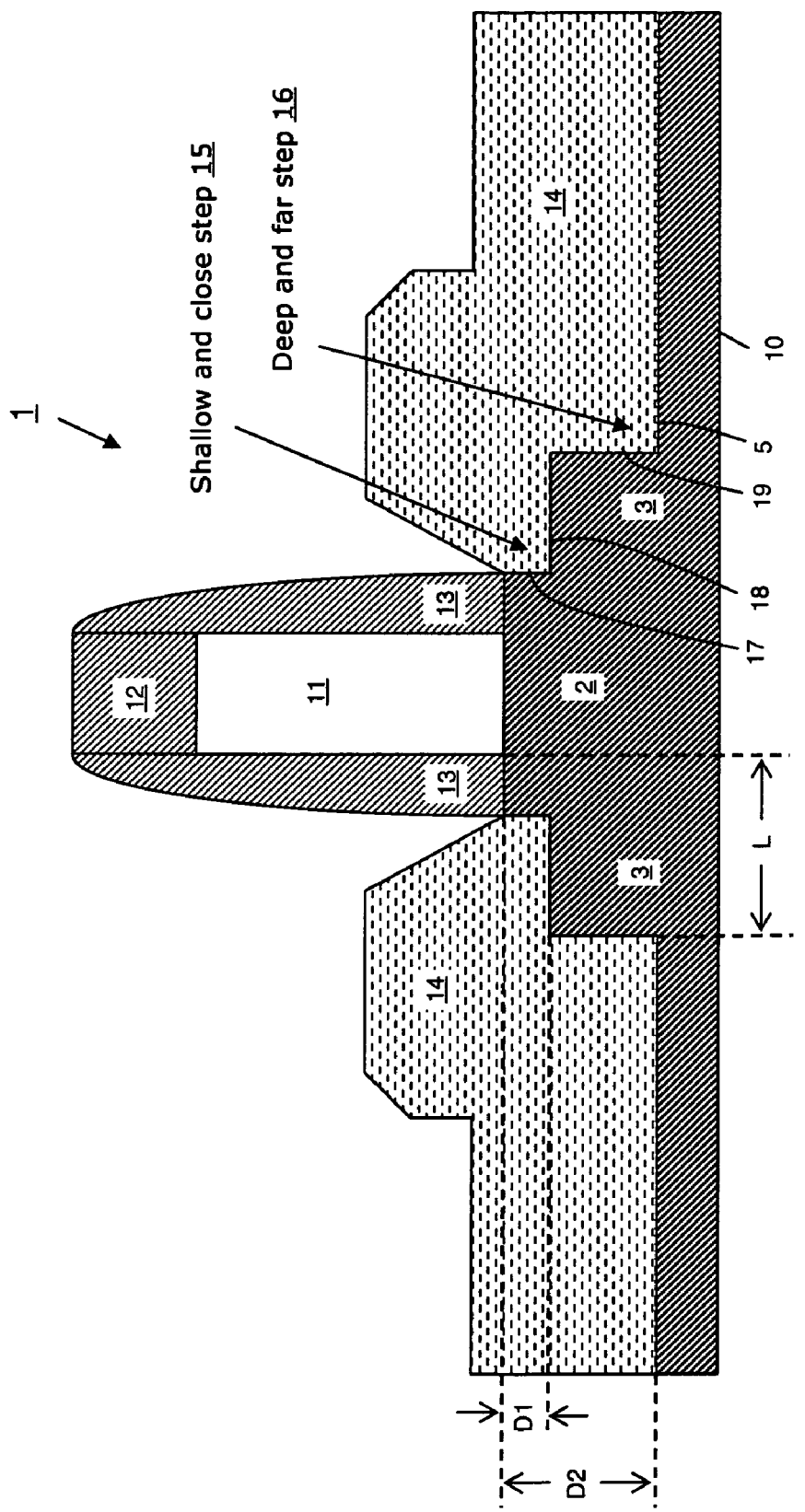
FIG. 1 is a side view of an illustrative embodiment of a step-embedded SiGe structure in accordance with at least one aspect of the present invention.

Referring to FIG. 1, an illustrative device PFET device 1 is shown having a step-embedded SiGe structure. In particular, device portion 1 includes a silicon body 10, over which a polysilicon PFET gate 11 is formed. Silicon body 10 has source/drain regions 3, as well as a channel region 2 (shown in FIG. 1 as being approximately between vertical broken lines) underneath gate 11 and between source/drain regions 3. The top of gate 11 is capped with an oxide layer 12. Gate 11 is surrounded laterally on opposing sides by an oxide spacer 13. In addition, an SiGe layer 14 formed on silicon body 10 over the source/drain regions, on the opposing sides of gate 11 and channel 2. Silicon body 10 and SiGe layer 14 are shaped such that, on each of the opposing sides, SiGe layer 14 has two steps 15, 16. Step 15 is formed at a relatively shallow level as compared with step 16. In addition, step 15 is formed so as to be laterally closer to gate 11 as compared with step 16. Thus, PFET 1 may be considered to have a shallow-and-close step 15 and a deep-and-far step 16 on each opposing side. The surface of silicon body 10 that SiGe layer 14 is disposed on is likewise shaped so as to cooperatively mate with steps 15, 16 of SiGe layer 14.

Looking more closely at the boundary between silicon body 10 and SiGe layer 14, each of first and second steps 15, 16 has a substantially planar side boundary 17, 19 that is substantially parallel to the sidewalls of gate 11 and/or to each other. However, side boundary 17 of step 15 is closer to gate 11 and/or channel 2 than side boundary 19 of step 16. For example, side boundary 17 may be aligned approximately with the outer edge of nearest oxide spacer 13, while side boundary 19 may be laterally spaced from the outer edge of nearest oxide spacer 13 by a distance L>0, such as approximately L=40 nm, or in the range of, e.g., 40-60 nm. In addition, step 15 has a substantially planar lower boundary 18 that is substantially parallel to and shallower than a substantially planar lower boundary 5 of step 16. To summarize the structure of the four boundaries/surfaces as shown in FIG. 1, lower boundary 18 extends at an angle (such as, e.g., approximately ninety degrees) from side boundary 17, side boundary 19 extends at an angle (such as, e.g., approximately ninety degrees) from lower boundary 18 and is spaced from side boundary 17 by at least lower boundary 18, and lower boundary 5 extends at an angle (such as, e.g., approximately ninety degrees) from side boundary 19 and is spaced from side boundary 17 and lower boundary 18 by at least side boundary 19. In an illustrative embodiment, lower boundary 18 of step 15 may have a depth measured from the bottom of gate 11 of approximately D1=20 nm, or in the range of, e.g., 15-25 nm, while lower boundary 5 of step 16 may have a depth measured from the bottom of gate 11 in the range of D2=50-60 nm. In general, depth D1 may be approximately 40% of depth D2. The above dimensions are merely illustrative; the particular dimensions of SiGe layer 14 may depend upon the desired properties of PFET 1.

It has been found that channel stress increases both as the SiGe layer approaches the channel and as the SiGe layer deepens. One might therefore conclude that channel stress may be increased simply by forming a deep and close SiGe layer. Unfortunately, such a configuration would significantly degrade the extension junction junction leakage current as well as increase SiGe epitaxial layer crystal defects. However, the particular SiGe configuration shown in FIG. 1 may allow increased compressive channel stress to be provided without necessarily running into these extension junction and crystal defect problems. This is because the lower portion of SiGe layer 14 is further from the PFET channel than the upper portion. In other words, the illustrated SiGe configuration allows for the best of both worlds: SiGe close to gate 11 and/or channel 15 at a shallow level, and SiGe further from gate 11 and/or channel 2 at a deeper level.

Although two steps 15, 16 are illustrated, more than two steps may be used as desired. For example, three, four, or more steps may be formed, each step being deeper into silicon body 10 and further from gate 11 and/or channel 2 than the previous step. It should also be noted that, although FIG. 1 and various other figures herein show an idealized set of steps with sharp, right-angle boundaries, in practice user steps 15, 16 may be rounded. Moreover, although discrete steps are included in various illustrative embodiments described herein, SiGe layer 14 may instead (or additionally) be more smoothly tapered with a simple or complex curved boundary without a sharp angle. In addition, where discrete steps are used, the side and lower boundaries of the steps may be at any angle to one another, such as approximately ninety degrees or any other angle. Regardless of whether a stepped boundary and/or a relatively smooth and curved boundary is formed, what is important is that SiGe layer 14 is formed such that it has a boundary that is closer to the PFET channel at shallower locations and further from the PFET channel at deeper locations.

Figure 2:
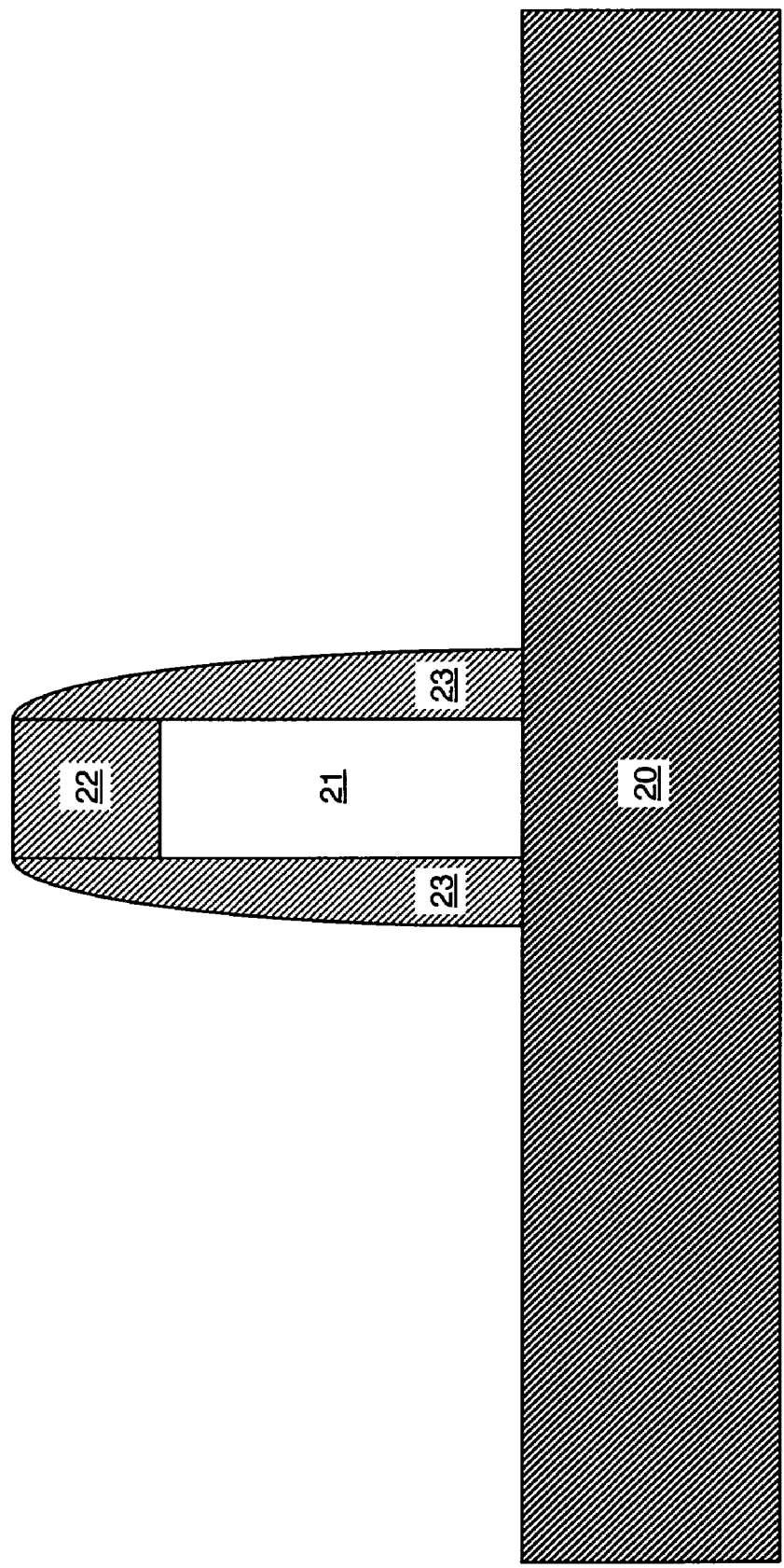
FIGS. 2-12 are side views of a structure during various steps in a process for manufacturing an illustrative embodiment of a step-embedded SiGe structure in accordance with at least one aspect of the present invention.

A first illustrative process for forming a PFET with a stepped SiGe embedded layer will now be described in connection with FIGS. 2-12. Referring to FIG. 2, a silicon-on-insulator (SOI) wafer is provided having a silicon body 20, a buried oxide (BOX) layer (not shown) under the silicon body 20, and a substrate (not shown) under the BOX layer. Silicon body 20 may be, for example, 50 to 70 nm in thickness, while the BOX layer may be, for example, approximately 150 nm in thickness. A polysilicon PFET gate 21 is formed on silicon body 20 in a conventional manner, and the top of gate 21 is capped with an oxide layer 22 that may be, for example, approximately 50 nm in thickness. Gate 21 may extend from silicon body 20 by, for example, approximately 100 nm. After reoxidation of the sidewalls of gate 21, gate 21 is surrounded laterally by an oxide spacer 23. Oxide spacer 23 may be, for example, approximately 10 nm in width.

Figure 3:
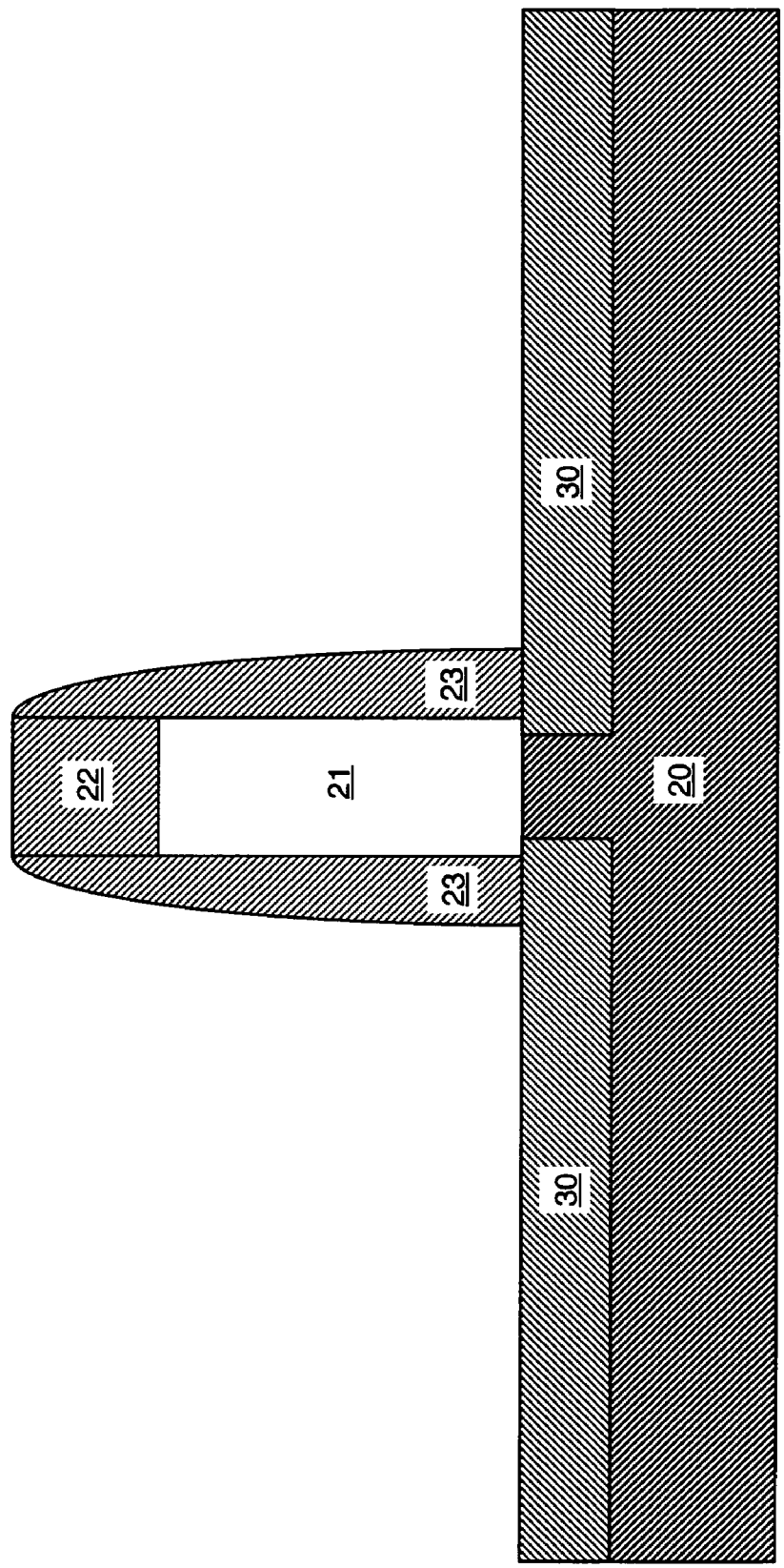

Referring to FIG. 3, a halo implant process is used to form an N-type diffusion region (not shown) and an extension implant process is used to form a P-type diffusion region 30 underneath oxide spacer 23 and/or gate 21.

Figure 4:
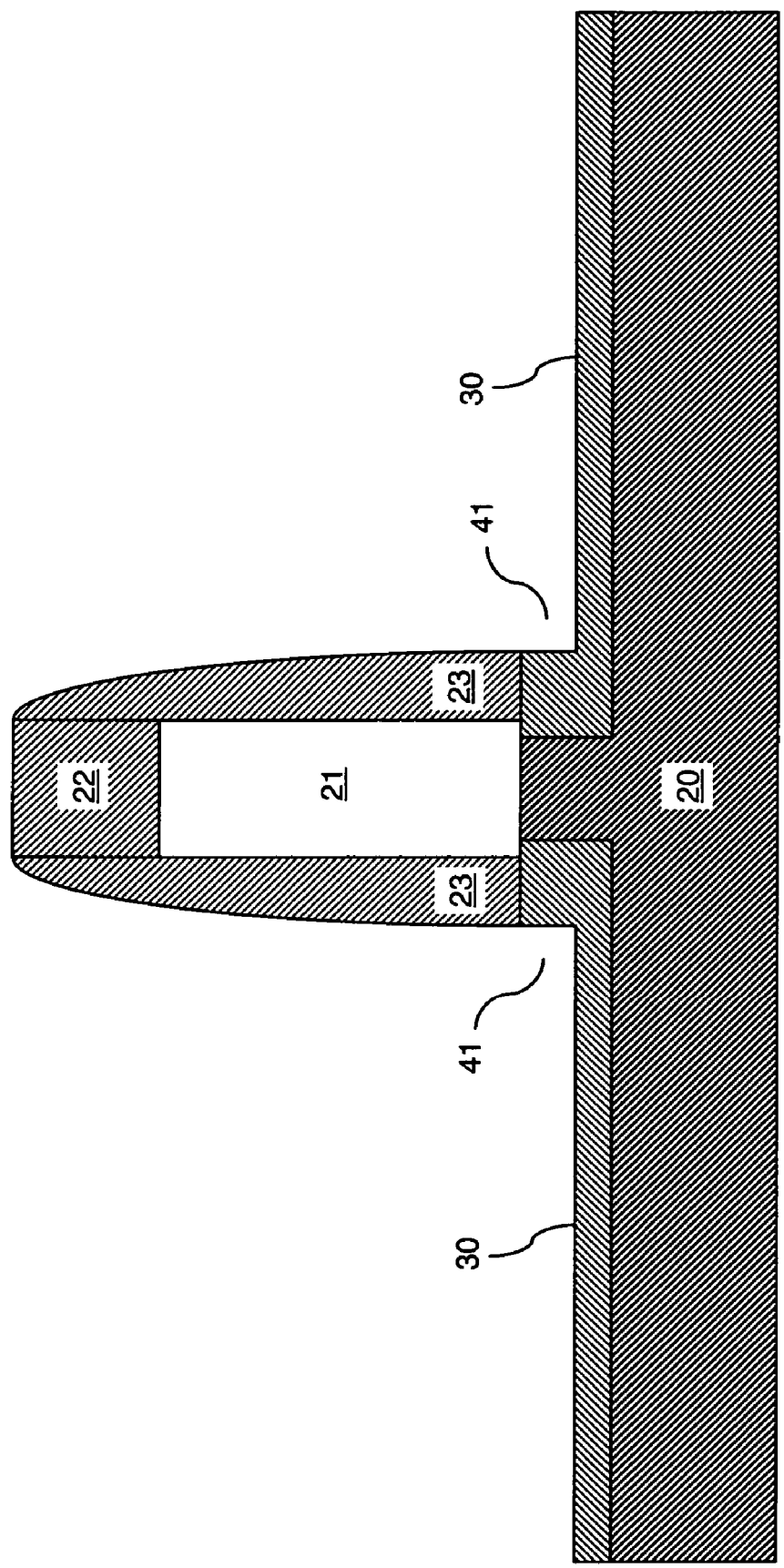

Referring to FIG. 4, using oxide spacer 23 and cap 22 as a mask, an etching process, such as a conventional reactive-ion etching (RIE) process, is used to etch away a shallow recess having a step region 41 in region 30. This step region 41 will be used later in the process to help form the upper step of the SiGe layer.

Figure 5:
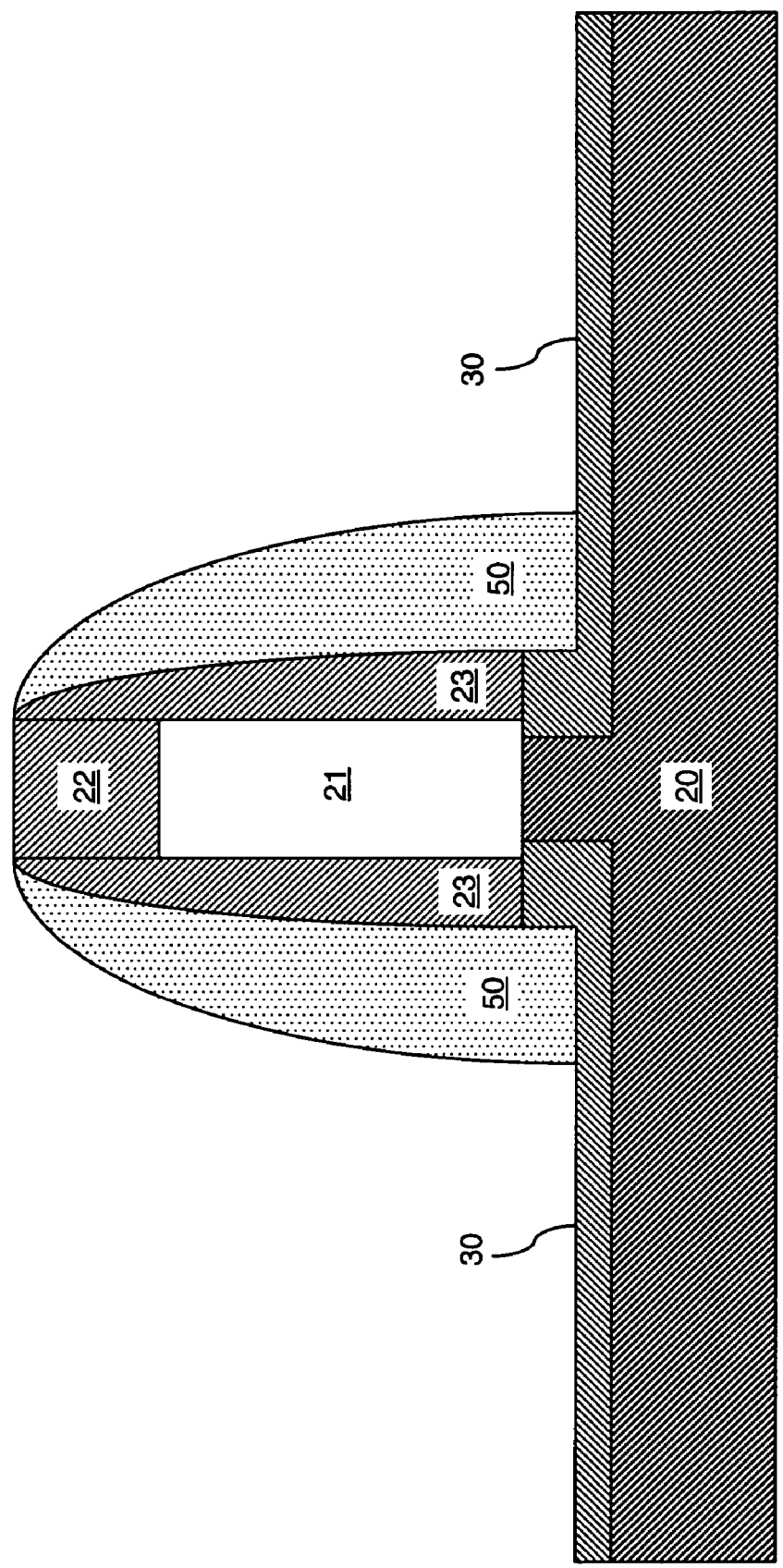

Referring to FIG. 5, a first SiN spacer 50 is formed on oxide spacer 23 and on a portion of shallow recessed region 30 that at least includes the portion of region 30 that defines step region 41.

Figure 6:
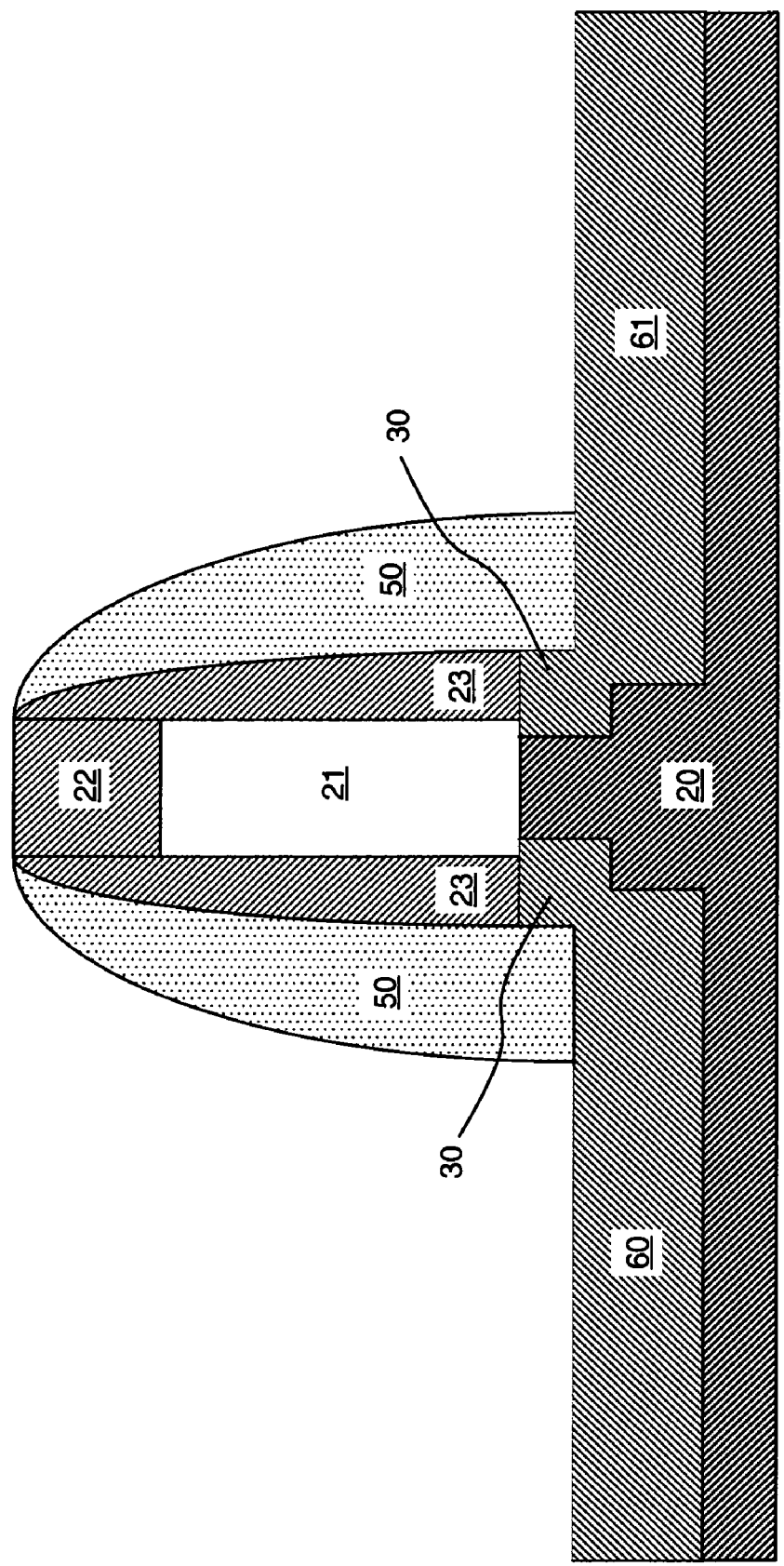

Referring to FIG. 6, source region 60 and drain region 61 are implanted.

Figure 7:
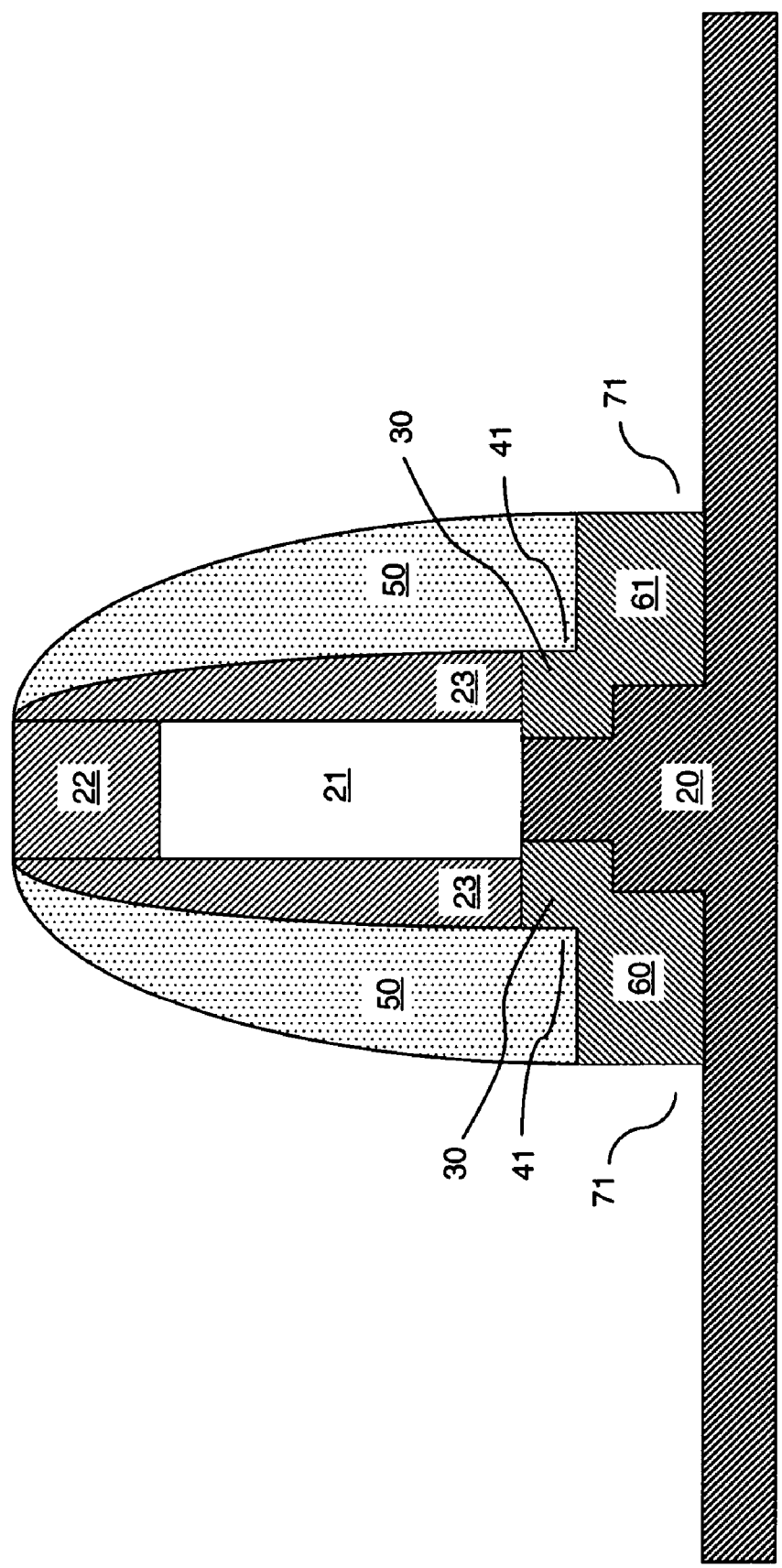

Referring to FIG. 7, using first SiN spacer 50 and cap 22 as a mask, the exposed portion of silicon body 20 (including the exposed portions of source/drain regions 60, 61) is etched using an etching process, such as a conventional RIE process, thereby forming a relatively deep recess having a step region 71 in silicon body 20. This step region 71 will be used later in the process to help form the lower step of the SiGe layer.

Figure 8:
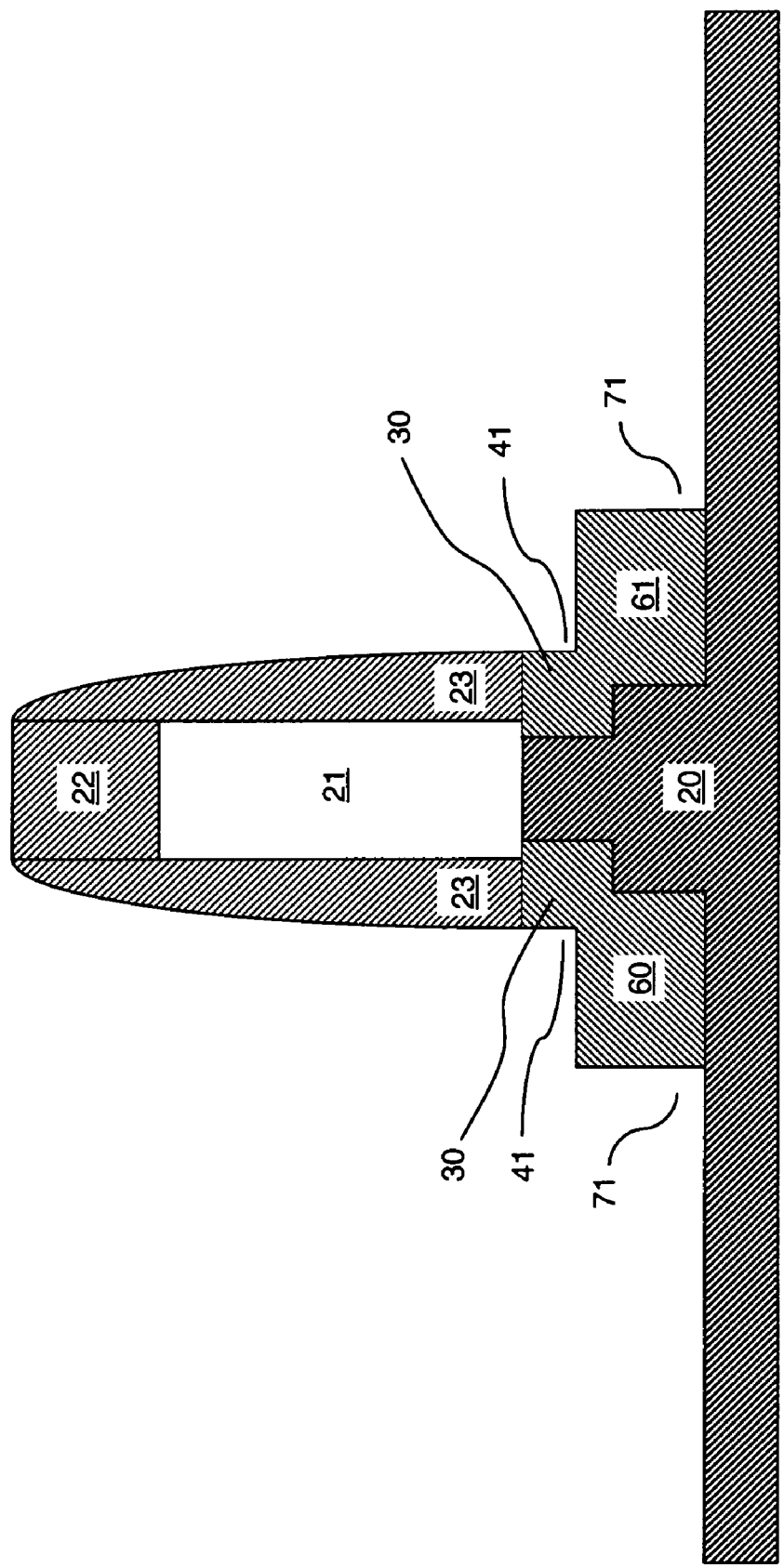

Referring to FIG. 8, first SiN spacer 50 is removed in preparation for forming a SiGe layer over the step regions 41, 71. Spacer 50 may be removed by hot H3PO4 wet etching.

Figure 9:
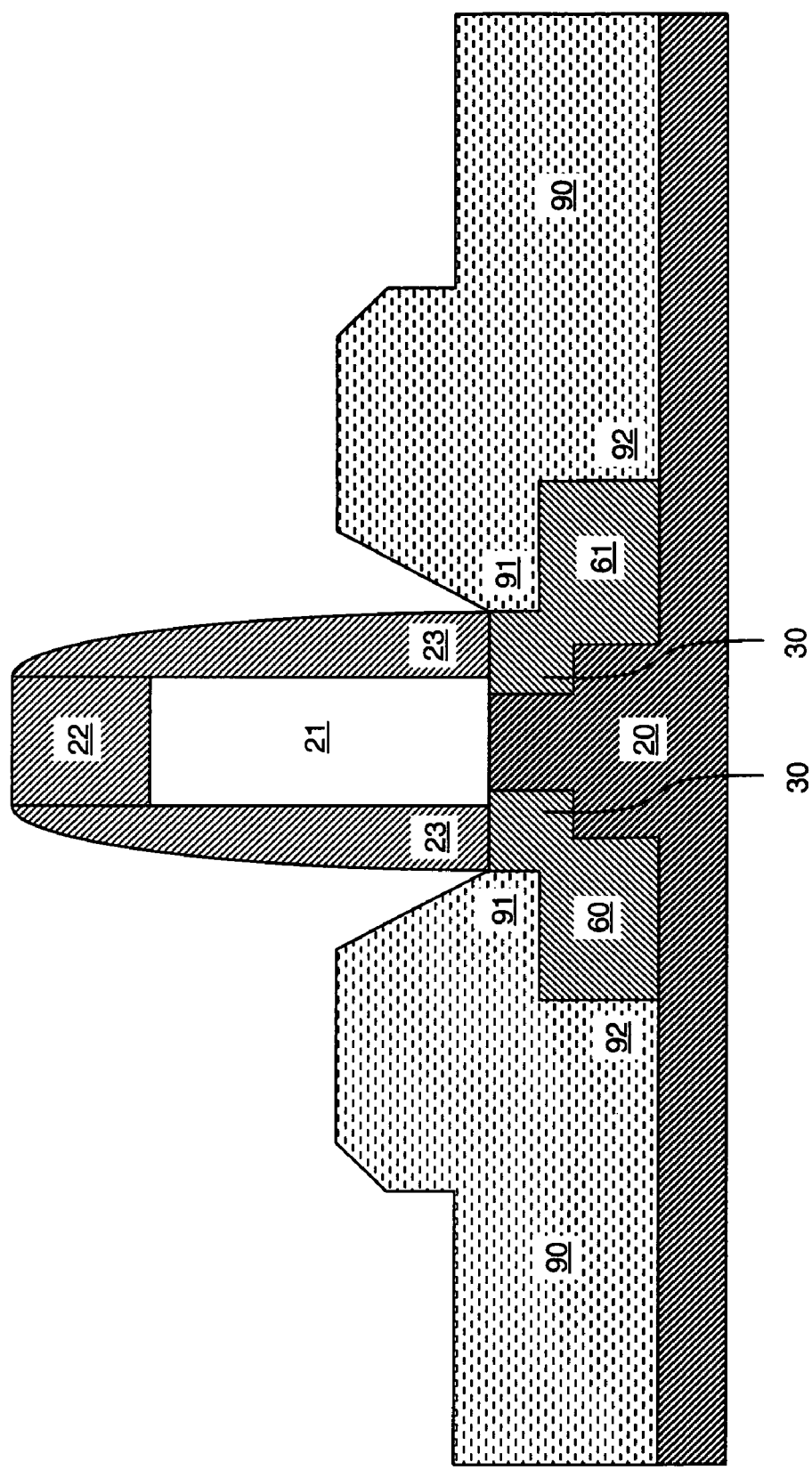

Referring to FIG. 9, a SiGe layer 90 is epitaxially grown on the recessed step regions 41, 71 defined by source/drain regions 60, 61 and by silicon body 20. Thus, due to the shape of step regions 41 and 71, SiGe layer 90 itself forms into a shape having an upper step 91 and a lower step 92. Of course, depending upon the process, any number of steps may be formed.

Figure 10:
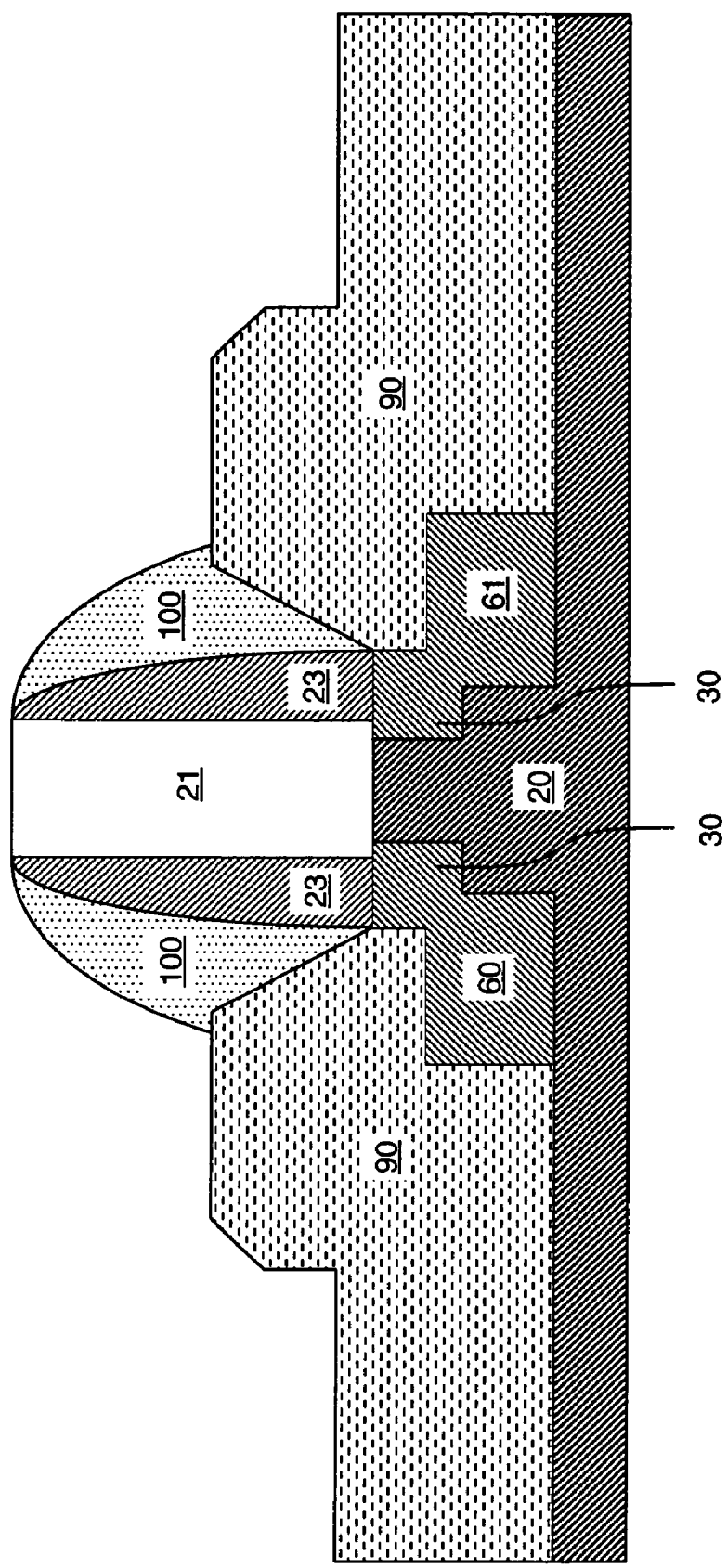

Referring to FIG. 10, a second SiN spacer 100 is formed on oxide spacer 23 and a portion of SiGe layer 90 using, for example, conventional blanket RIE.

Figure 11:
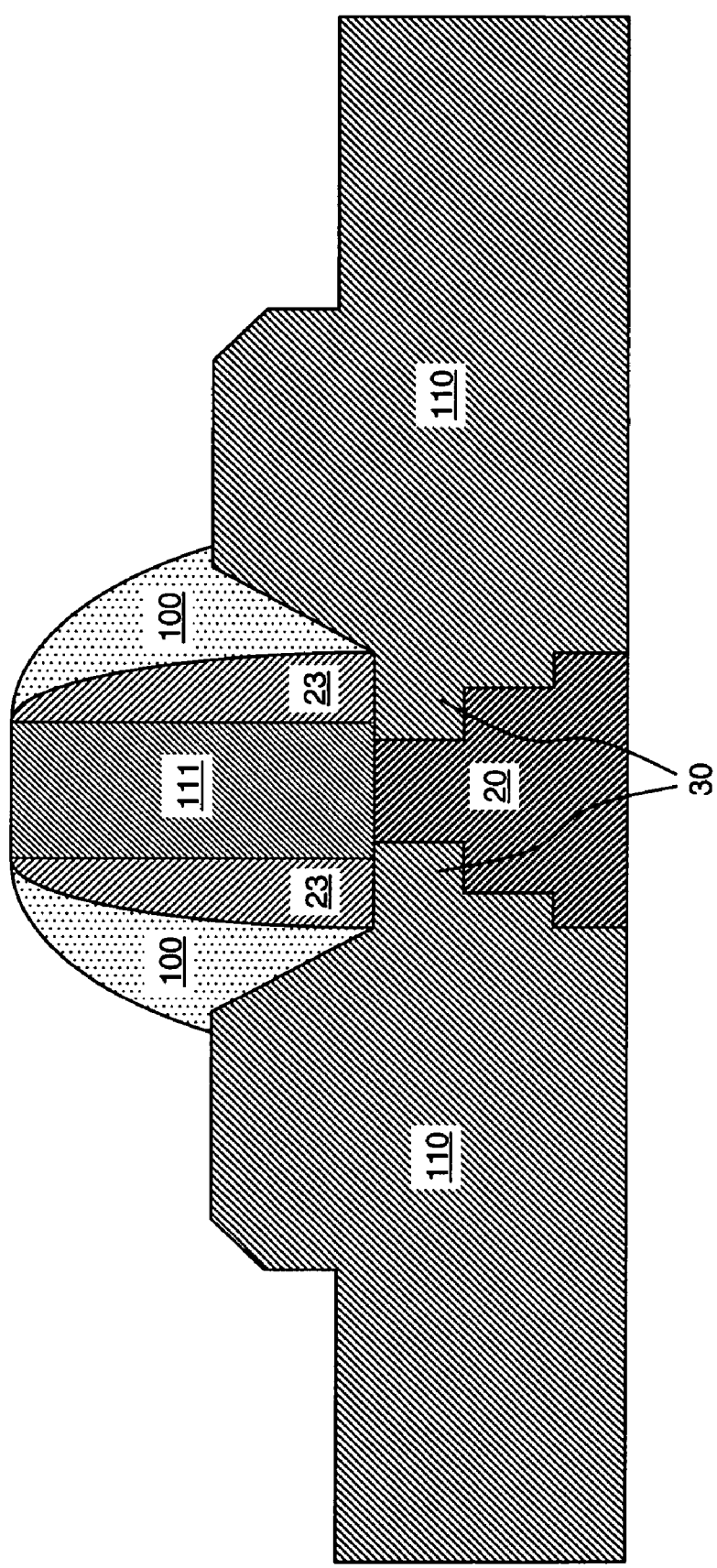

Referring to FIG. 11, gate 21 and source/drain regions 60, 61 are doped by conventional implantation and annealing, resulting in doped gate 111 and doped region 110.

Figure 12:
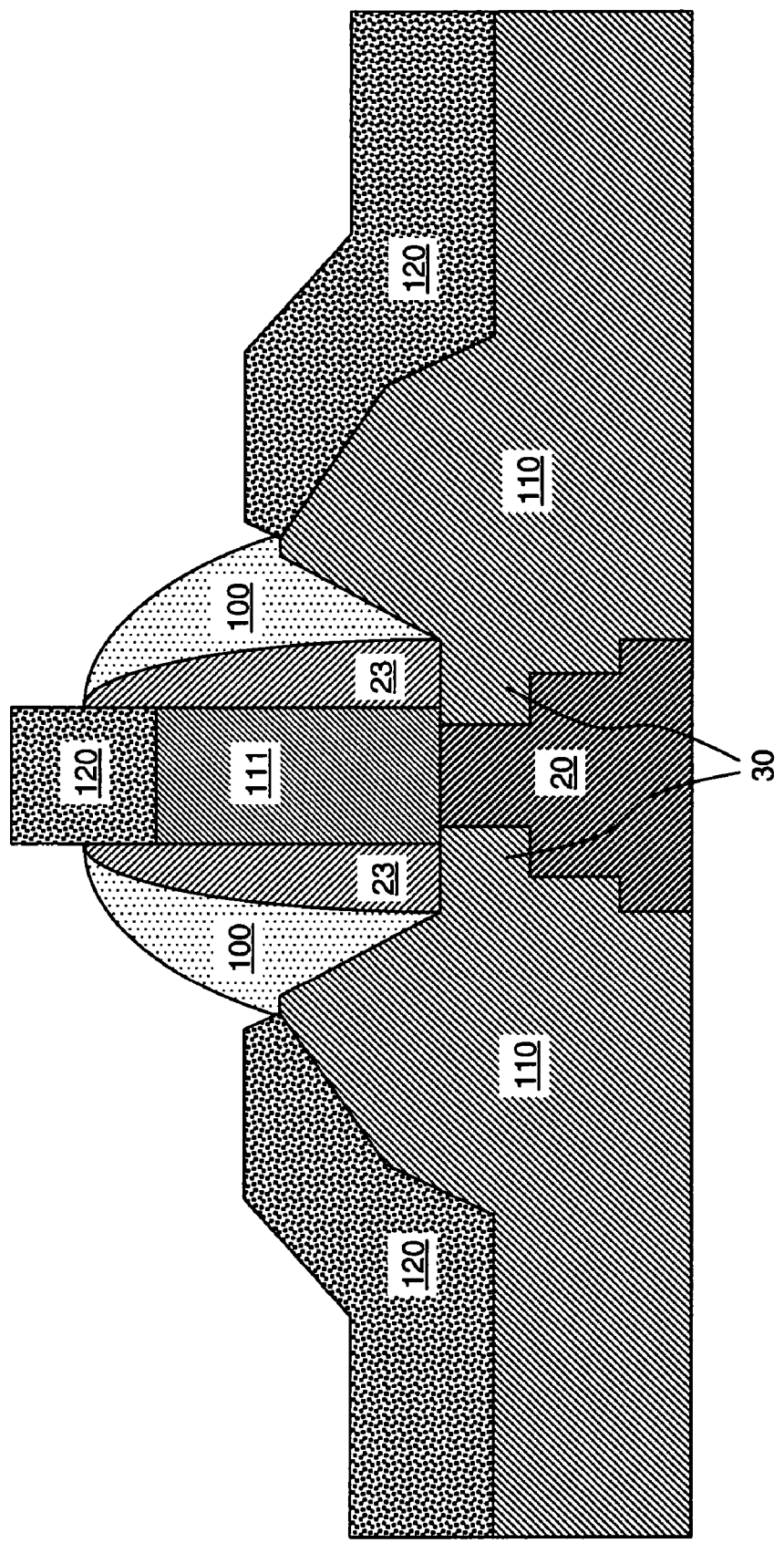

Referring to FIG. 12, a nickel silicide layer 120 is formed on doped gate 111 as well as on doped region 110 (and thus on source/drain regions 60, 61).

Figure 13:
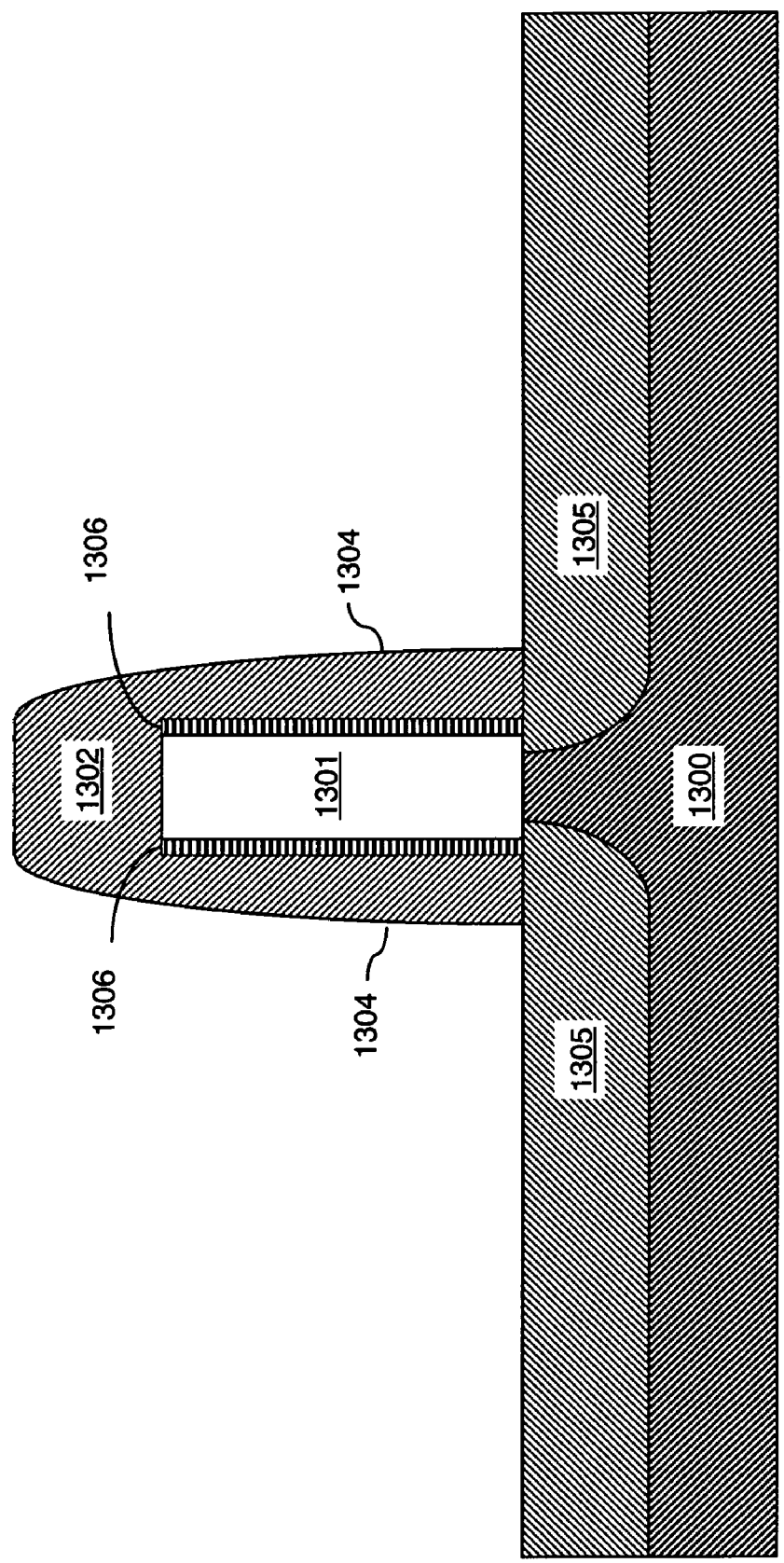
FIGS. 13-22 are side views of another structure during various steps in a process for manufacturing another illustrative embodiment of a step-embedded SiGe structure in accordance with at least one aspect of the present invention.

A second illustrative process for forming a PFET with a stepped SiGe embedded layer will now be described in connection with FIGS. 13-22. Referring to FIG. 13, a silicon body 1300 has a 20-30 nm P-type diffusion region 1305 formed by an extension implant process underneath a first SiN spacer 1304 and/or a polysilicon gate 1301. The extension implant process may use, e.g., a boron difluoride (BF2) implant at 3 KeV with a dose of 1E15 cm−2 in order to extend diffusion region 1305 outward from first SiN spacer 1304. A halo implant process may also be used, such as an arsenic (A) implant at 60 KeV with a dose of 5E13 cm−2 at a 30 degree angle. First SiN spacer 1304 surrounds gate 1301, and gate 1301 has a re-oxidation layer 1306 sandwiched between gate 1301 and SiN spacer 1304. Also, a SiN cap 1302 is disposed on top of gate 1301.

Figure 14:
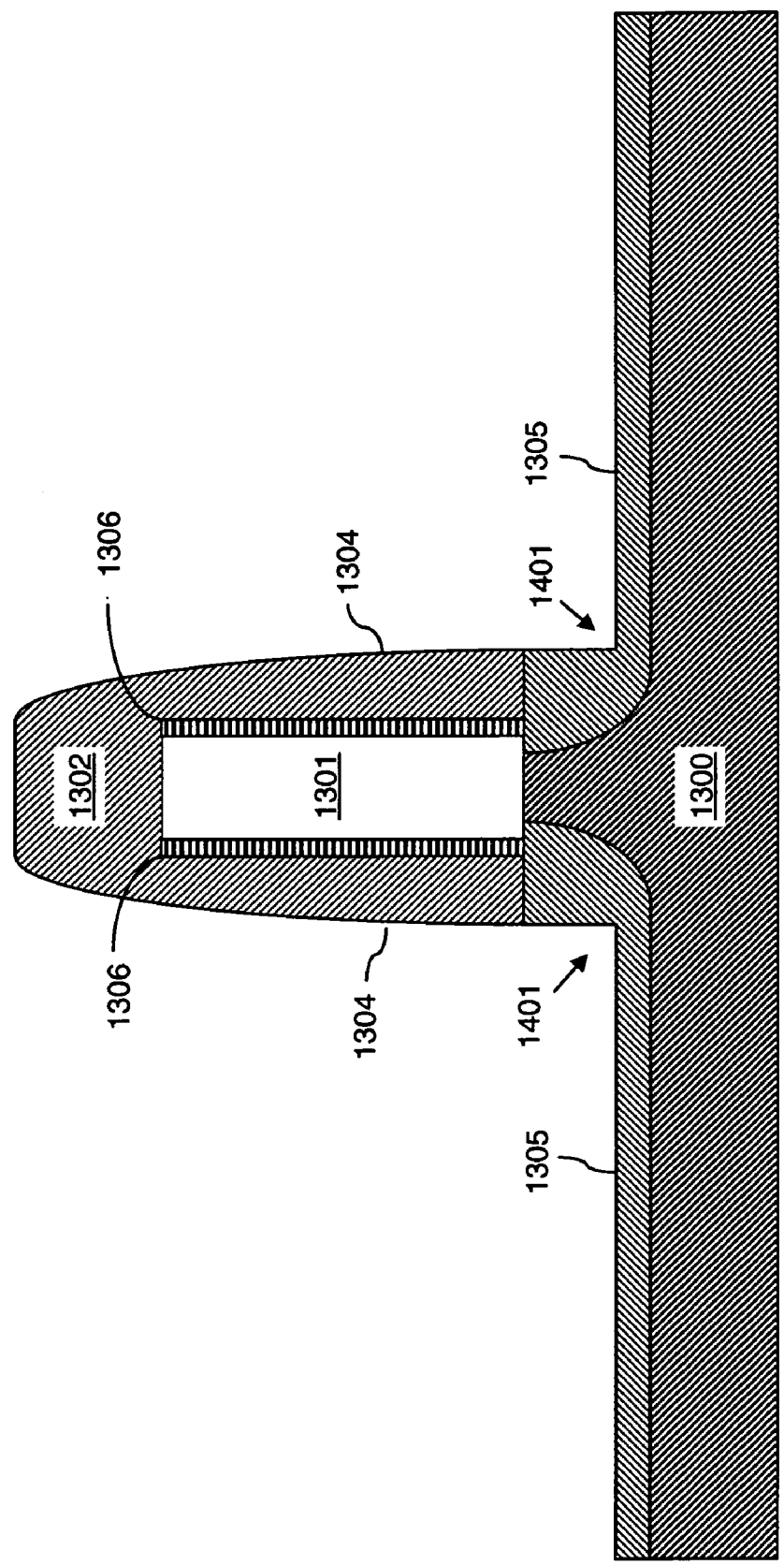

Referring to FIG. 14, using first SiN spacer 1304 and cap 1302 as a mask, an etching process, such as a conventional Si RIE process, is used to etch away a shallow recess having a step region 1401 in diffusion region 1305. This step region 1401 will be used later in the process to help form the upper step of the SiGe layer.

Figure 15:
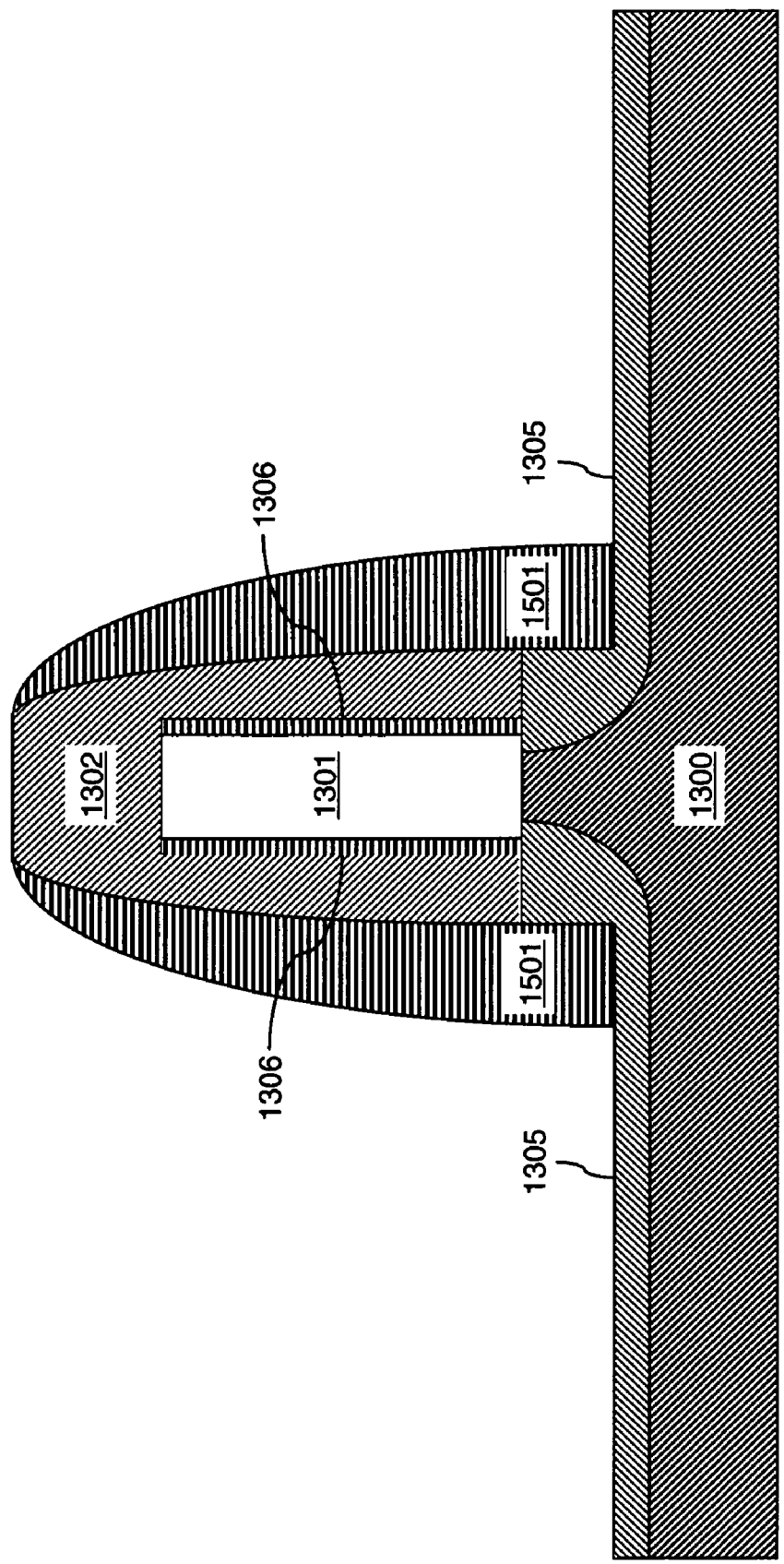

Referring to FIG. 15, an oxide spacer 1501 is formed on first SiN spacer 1304 and on a portion of shallow recessed P-type diffusion region 1305 that at least includes the portion of regions 1305 that define step regions 1401. Oxide spacer 1501 is about, e.g., 30 nm in thickness and is formed by oxide deposition followed by blanket RIE.

Figure 16:
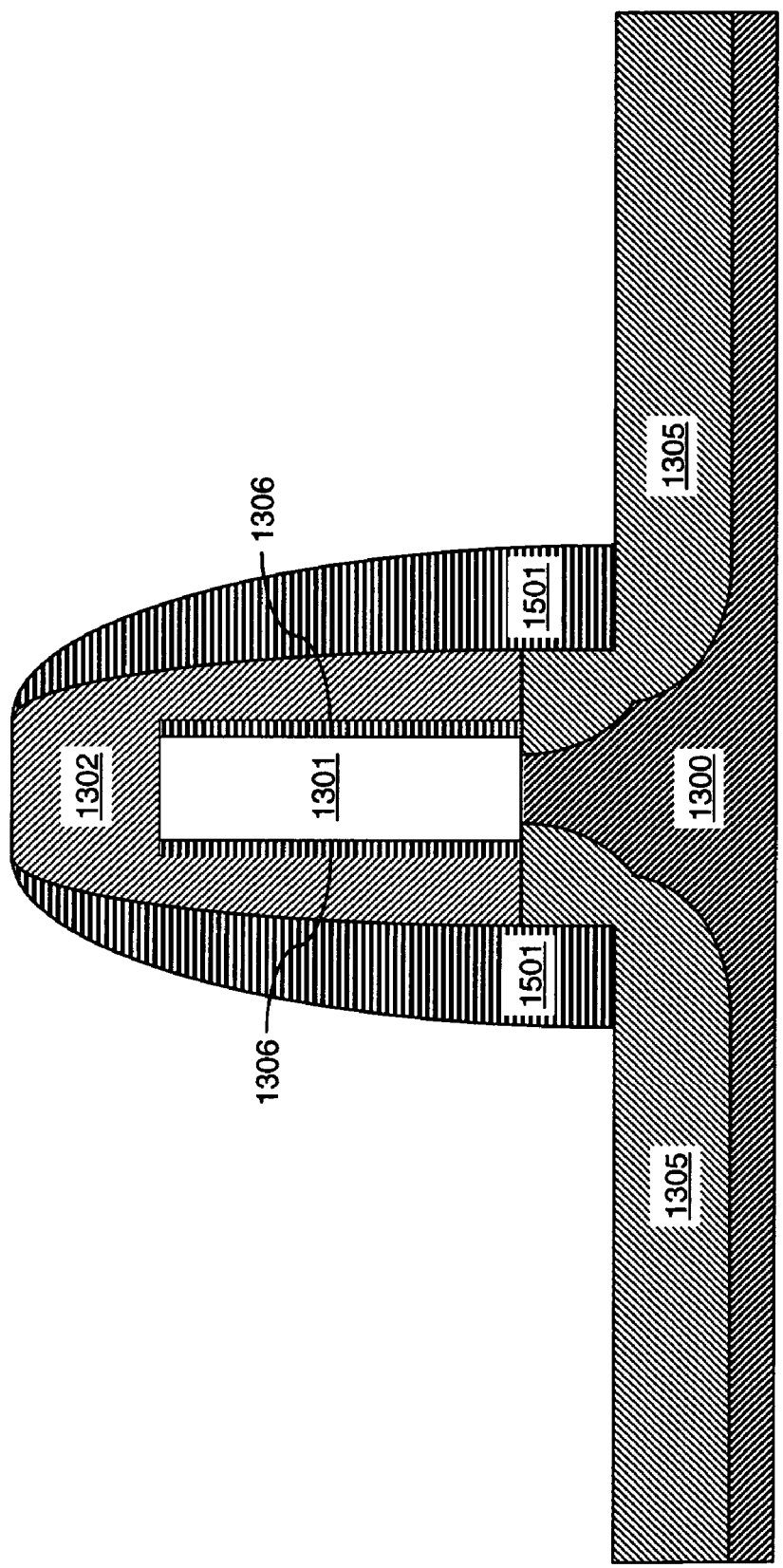

Referring to FIG. 16, source and drain regions 1305 are implanted. In this example, BF2 implantation is used at approximately 20 KeV, $1\times10^{15}$ cm$^{-2}$. A thin layer of unimplanted silicon 1300 remains underneath the source and drain regions 1305. This thin layer may be, e.g., about 10 nm in thickness.

Figure 17:
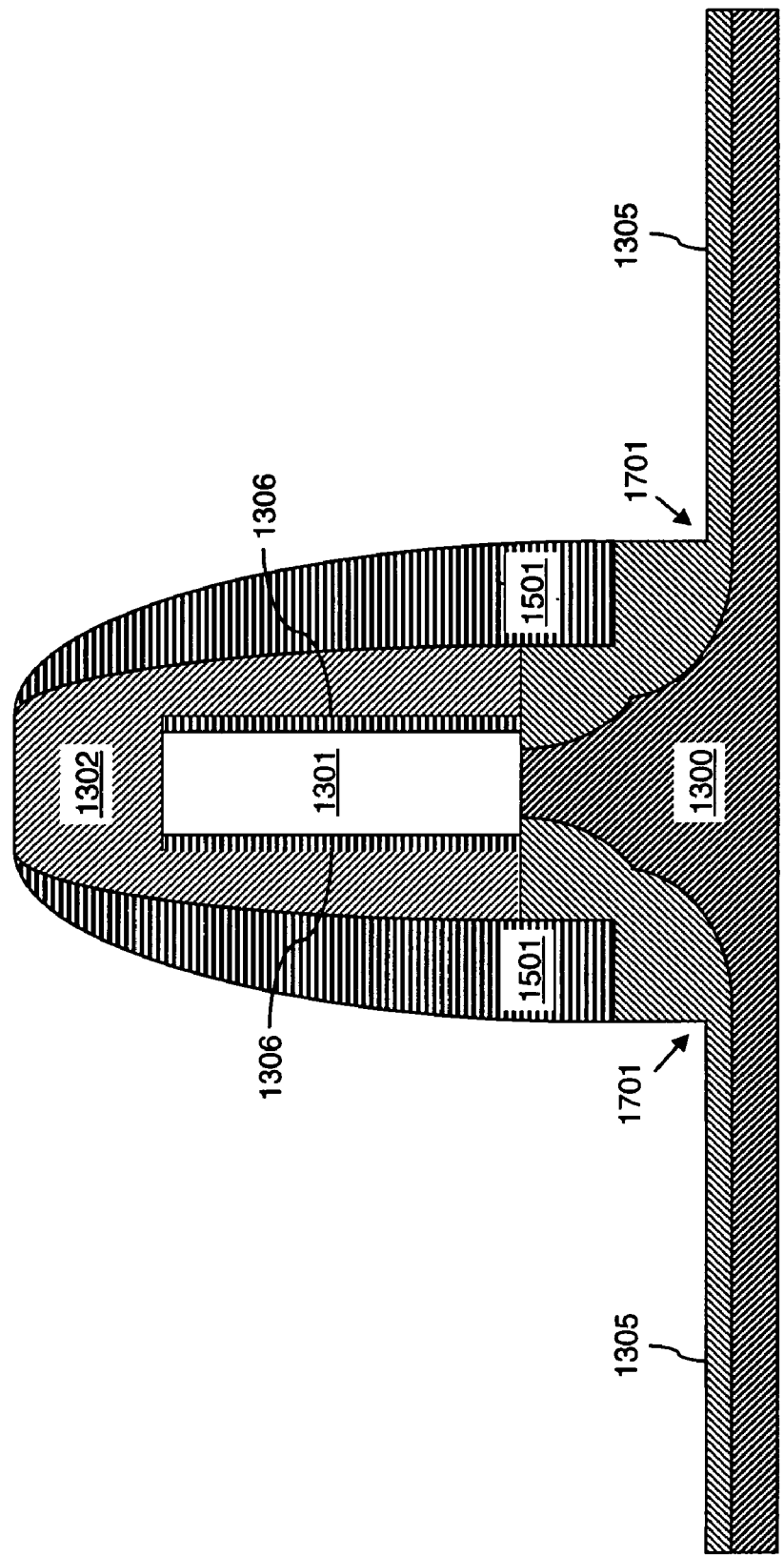

Referring to FIG. 17, using oxide spacer 1501 and cap 1302 as a mask, the exposed portion of silicon body 1300 (including the exposed portions of source/drain regions 1305) is etched, such as by using a conventional RIE process, thereby forming a relatively deep recess having a step region 1701 in silicon body 1300. This step region 1701 will be used later in the process to help form the lower step of the SiGe layer. Silicon body 1300 is etched so as to leave a thin layer (e.g., approximately 10 nm thick) of silicon remaining.

Figure 18:
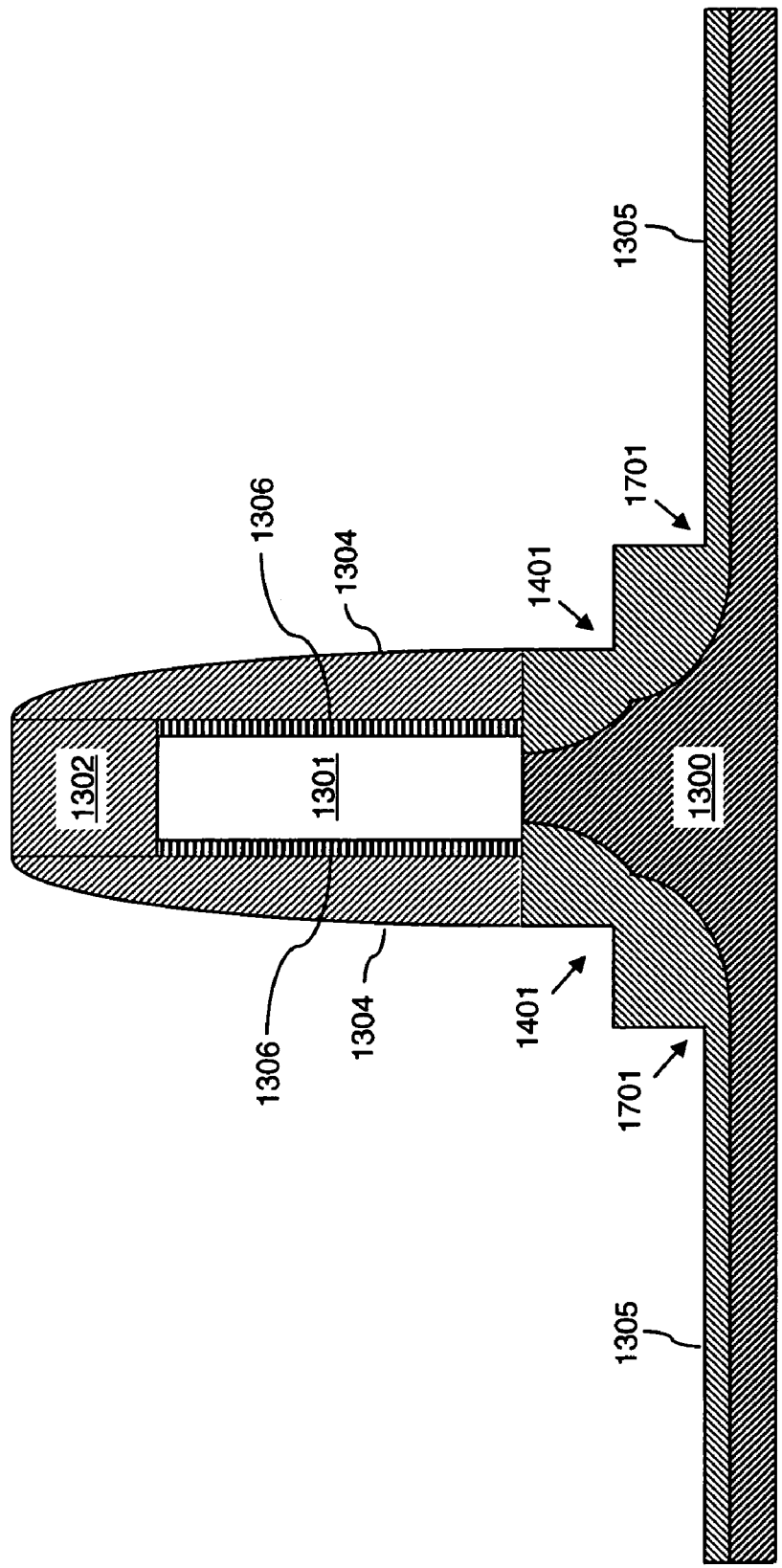

Referring to FIG. 18, oxide spacer 1501 is removed (for example, using diluted HF wet etching), in preparation for forming a SiGe layer over the step regions 1401, 1701.

Figure 19:
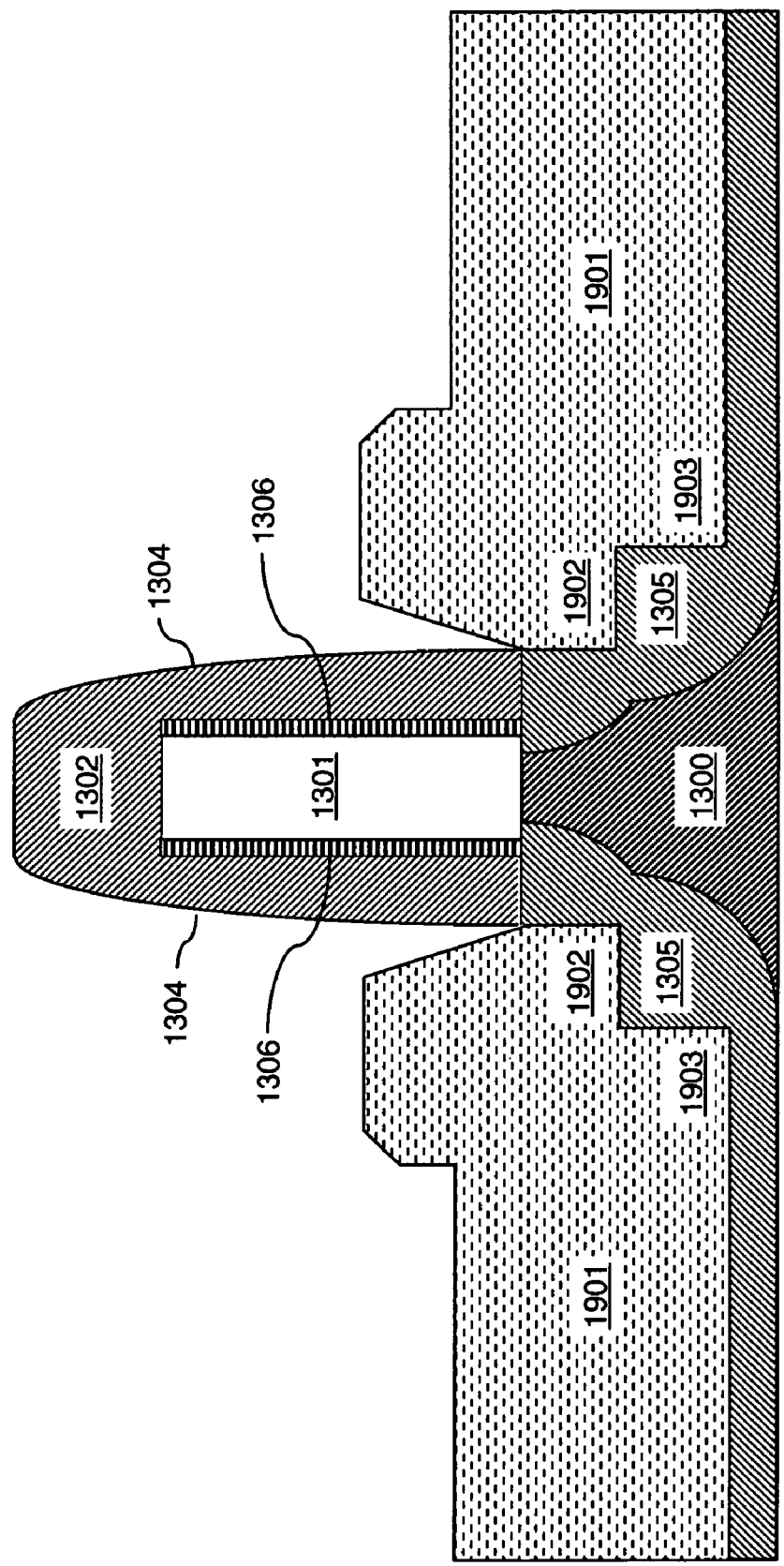

Referring to FIG. 19, in situ Boron-doped SiGe is epitaxially grown on the recessed step regions 1401, 1701, resulting in a SiGe layer 1901 that is approximately 60-70 nm in thickness. Boron in SiGe is diffused into silicon body 1300, and then P-type diffusion layer 1305 is extended downward to the BOX (not shown). Thus, due to the shape of step regions 1401 and 1701, SiGe layer 1901 itself forms into a shape having an upper step 1902 and a lower step 1903. Of course, depending upon the process, any number of steps may be formed.

Figure 20:
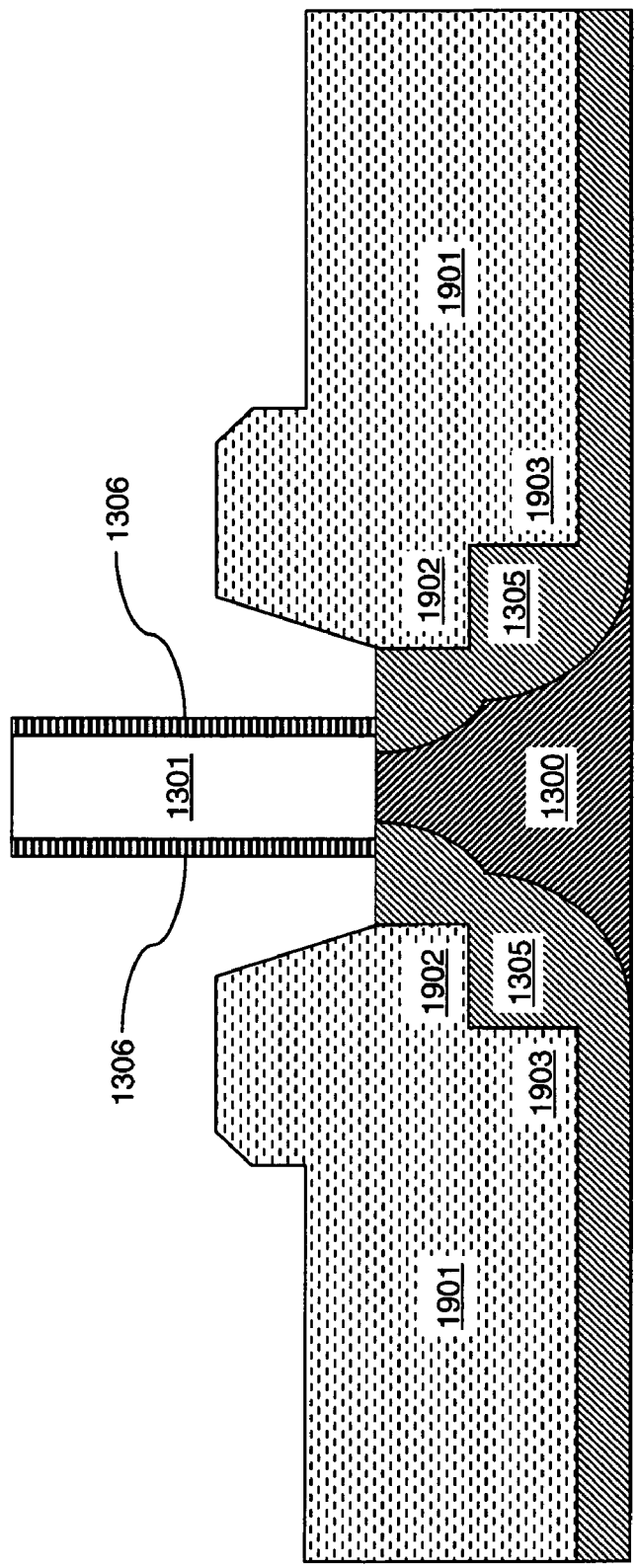

Referring to FIG. 20, first SiN spacer 1304 and SiN cap 1302 are removed (for example, by hot H3PO4 wet etching) to expose the top of polysilicon gate 1301.

Figure 21:
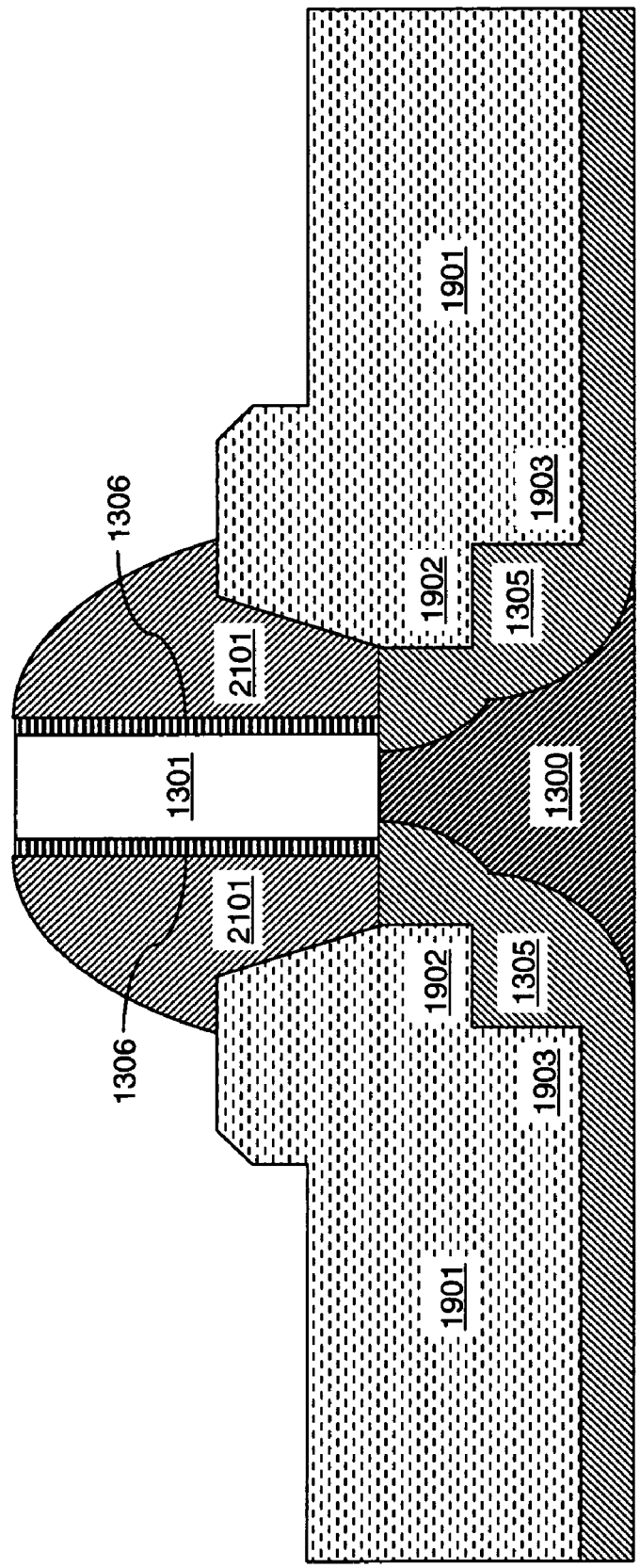

Referring to FIG. 21, a second SiN spacer 2101 is formed on re-oxidation layer 1306 and a portion of SiGe layer 1901 using, for example, conventional blanket RIE, in order to separate gate 1301 from source/drain regions 1305.

Figure 22:
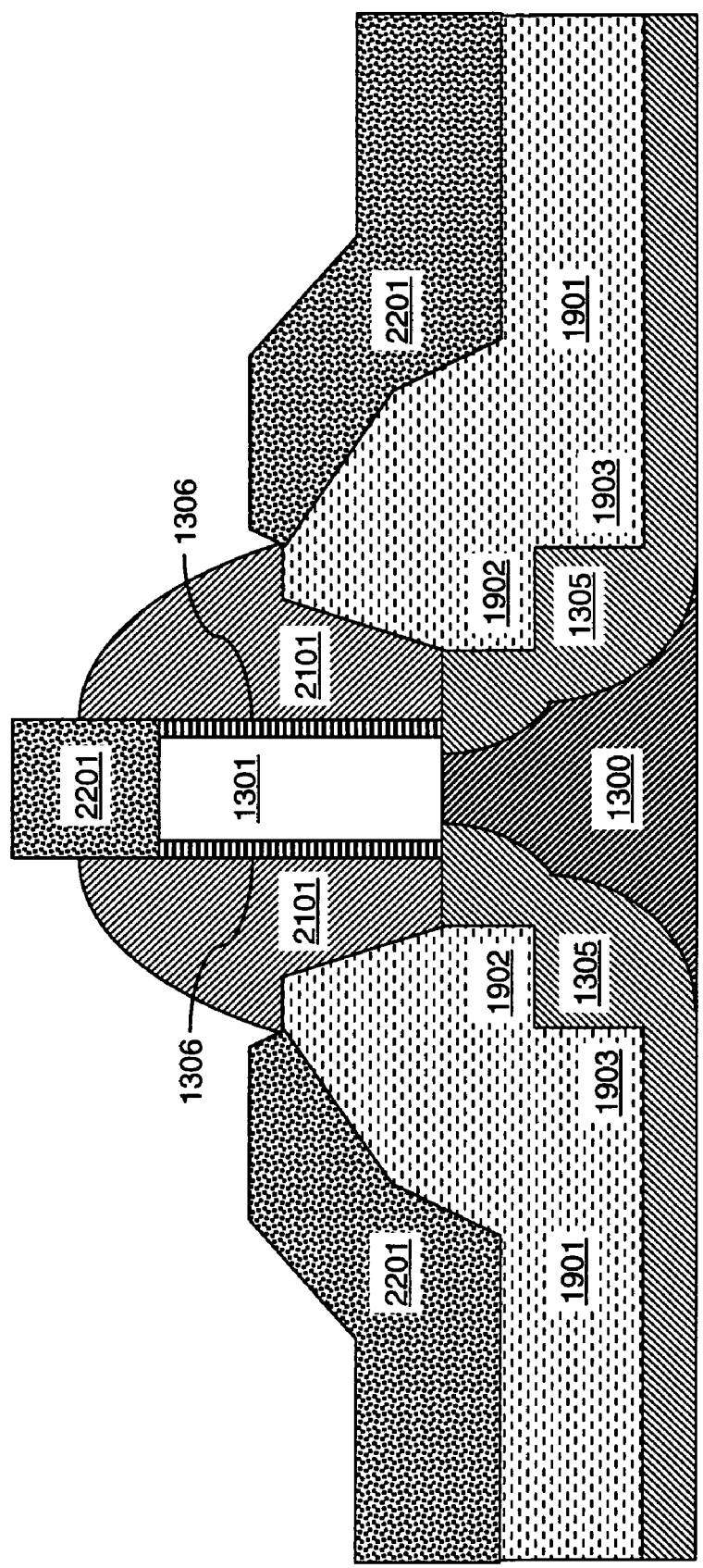
Figure 23:
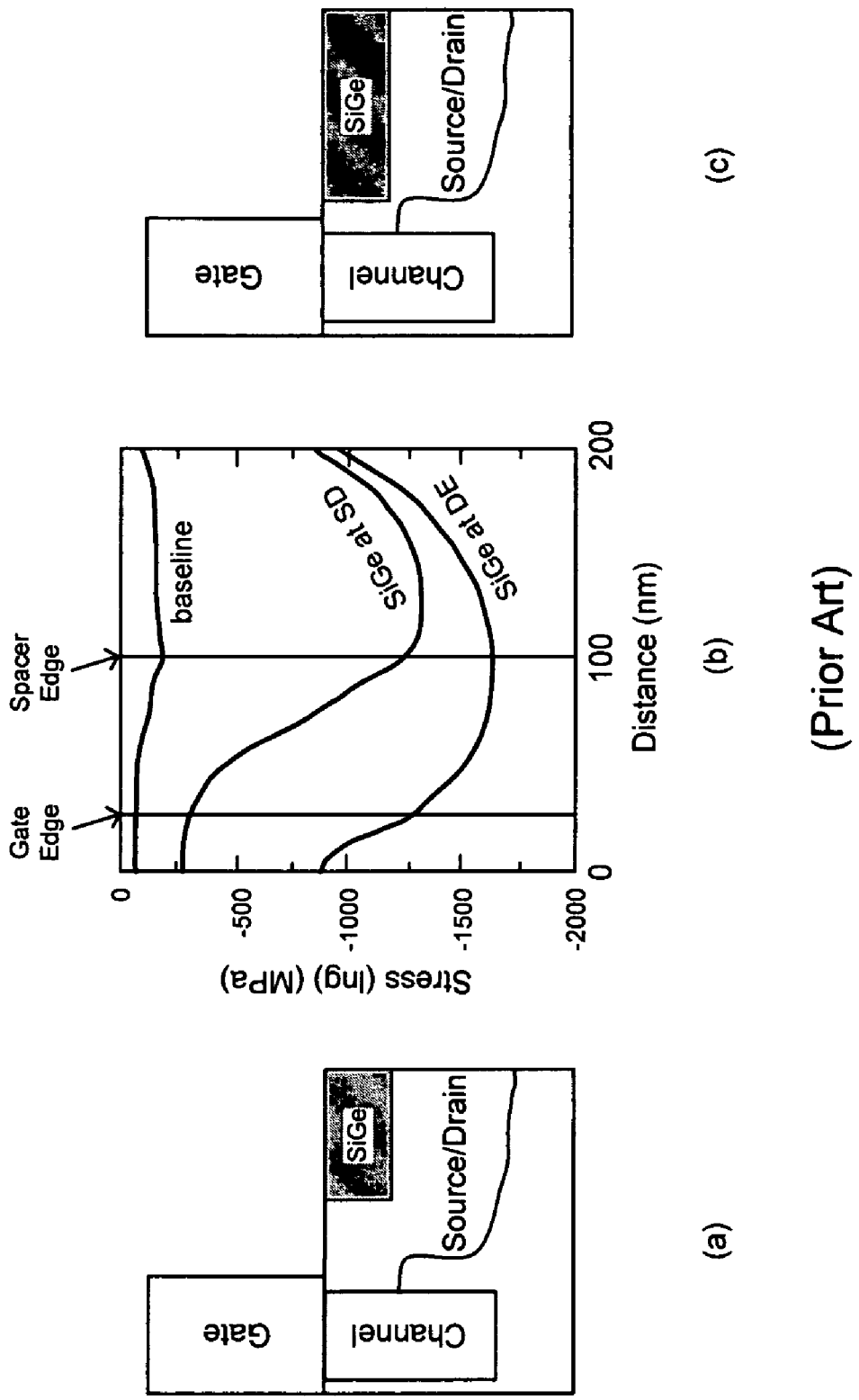
FIG. 23 illustrates conventional SiGe structures.

Referring to FIG. 22, a deposition of nickel silicide 2201 is formed on gate 1301, re-oxidation layer 1306, and source/drain regions 1305, following silicidation annealing. The remaining pure nickel is removed, such as by wet etching.

Thus, new structures, and methods for making such structures, have been described, that allow substantial compressive stress to be placed on a PFET channel without necessarily substantially degrading the properties of the PFET channel.

What is claimed is:

1. A semiconductor device having a PFET, the PFET comprising:
    a silicon body having a PFET channel;
    a first SiGe layer portion disposed on a first side of the channel and having a multi-stepped boundary facing the channel; and
    a second SiGe layer portion disposed on a second opposite side of the channel and having a multi-stepped boundary facing the channel.

2. The semiconductor device of claim 1, wherein the silicon body has a multi-stepped boundary on each of the first and second sides, wherein the multi-stepped boundary of each of the first and second SiGe layer portions is disposed directly on the multi-stepped boundary of the silicon body.

3. The semiconductor device of claim 1, wherein the PFET further includes a gate disposed on the silicon body and having sidewalls, and wherein the multi-stepped boundary of each of the first and second SiGe layer portions includes:
    a first side boundary and a second side boundary each substantially parallel to each other, wherein the first side boundary is closer to the channel than the second side boundary; and
    a first lower boundary and a second lower boundary each substantially parallel to each other, wherein the first lower boundary is closer to the gate than the second lower boundary.

4. The semiconductor device of claim 3, further including a first oxide spacer disposed on the silicon body on the first side of the gate and a second oxide spacer disposed on the silicon body on the second side of the gate, wherein the first side boundary of the first and second SiGe layer portions is substantially aligned with an outer boundary of the first or second oxide spacer, respectively.

5. A semiconductor device having a PFET, the PFET comprising:
    a gate;
    a silicon body, wherein the gate is disposed on the silicon body, and wherein the silicon body has, on each of two opposing sides of the gate:
    a first surface,
    a second surface extending at an angle from the first surface,
    a third surface extending at an angle from the second surface and spaced from the first surface by at least the second surface, and
    a fourth surface extending at an angle from the third surface and spaced from the first and second surfaces by at least the third surface; and
    a SiGe layer disposed on the first, second, third, and fourth surfaces of the silicon body on each of the two opposing sides of the gate.

6. The semiconductor device of claim 5, wherein the gate has sidewalls, and wherein the first and third surfaces on each of the two opposing sides are substantially parallel to the sidewalls of the gate.

7. The semiconductor device of claim 6, wherein the PFET further includes an oxide spacer on each of the two sidewalls of the gate, and wherein the first surface on each of the two opposing sides is substantially aligned with an outer boundary of a respective one of the oxide spacers.

8. The semiconductor device of claim 5, wherein the first and third surfaces are substantially parallel to each other, and the second and fourth surfaces are substantially parallel to each other.

9. The semiconductor device of claim 5, wherein the second and fourth surfaces are substantially planar.

10. The semiconductor device of claim 5, wherein the SiGe layer is disposed directly on the fist, second, third, and fourth surfaces.

11. A semiconductor device having a PFET, the PFET comprising:
    a silicon layer including a silicon PFET channel;
    a first SiGe layer portion disposed on a first side of the silicon PFET channel and having a multi-stepped surface dividing the silicon layer from the first SiGe layer portion; and
    a second SiGe layer portion disposed on a second opposite side of the silicon PFET channel and having a multi-stepped surface dividing the silicon layer from the second SiGe layer portion.

12. The semiconductor device of claim 11, wherein the silicon layer has a multi-stepped surface on each of the first and second sides, wherein the multi-stepped surface of each of the first and second SiGe layer portions is disposed directly on the multi-stepped surface of the silicon layer.

13. The semiconductor device of claim 11, wherein the PFET further includes a gate disposed on the silicon layer and having sidewalls, and wherein the multi-stepped surface of each of the first and second SiGe layer portions includes:

a first side surface and a second side surface each substantially parallel to each other, wherein the first side surface is closer to the silicon PFET channel than the second side surface; and a first lower surface and a second lower surface each substantially parallel to each other, wherein the first lower surface is closer to the gate than the second lower surface.

14. The semiconductor device of claim 13, further including a first oxide spacer disposed on the silicon layer on the first side of the gate and a second oxide spacer disposed on the silicon layer on the second side of the gate, wherein the first side surface of the first and second SiGe layer portions is substantially aligned with an outer suface of the first or second oxide spacer, respectively.

* * * * *